(12) United States Patent
Watanabe et al.

(10) Patent No.: US 8,764,490 B2
(45) Date of Patent: Jul. 1, 2014

(54) RELAY CONNECTOR, MODULE, MODULE DEVICE, AND LUMINAIRE

(75) Inventors: Hiroyuki Watanabe, Yokosuka (JP); Takeshi Osada, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 98 days.

(21) Appl. No.: 13/619,021

(22) Filed: Sep. 14, 2012

(65) Prior Publication Data

US 2013/0252472 A1  Sep. 26, 2013

(30) Foreign Application Priority Data

Mar. 26, 2012  (JP) ................................ 2012-070445
Jun. 19, 2012  (JP) ................................ 2012-137652

(51) Int. Cl.
*H01R 25/00*  (2006.01)

(52) U.S. Cl.
USPC ............... 439/638; 362/97.1; 362/249.02; 362/217.13

(58) Field of Classification Search
USPC .............. 439/638, 76.1; 362/249.01–249.01, 362/217.12–217.13, 219, 249.06, 97.1
See application file for complete search history.

(56) References Cited

U.S. PATENT DOCUMENTS

| | | | | |
|---|---|---|---|---|
| 7,717,580 B2* | 5/2010 | Takata et al. | ................. | 362/97.1 |
| 7,896,513 B2* | 3/2011 | Takata et al. | ................. | 362/97.1 |
| 7,901,101 B2* | 3/2011 | Takata et al. | ................. | 362/97.1 |
| 8,454,193 B2* | 6/2013 | Simon et al. | ............. | 362/217.17 |
| 8,540,385 B2* | 9/2013 | Naito | .......................... | 362/97.1 |

FOREIGN PATENT DOCUMENTS

JP  2011-258420  12/2011

* cited by examiner

*Primary Examiner* — Xuong Chung Trans
(74) *Attorney, Agent, or Firm* — Patterson & Sheridan, LLP.

(57) ABSTRACT

According to one embodiment, a relay connector connects two input connectors respectively mounted on mounting surfaces of two substrates, ends of which are arranged to be opposed to each other. The relay connector includes a relay connector main body and relay terminals. The relay connector main body includes a substrate regulating section interposed between the ends of the two substrates and set in contact with the ends of the two substrates to form a space between the ends of the two substrates. The relay terminals project from both ends of the relay connector main body to be connected to the input connectors.

20 Claims, 6 Drawing Sheets

RELAY CONNECTOR, MODULE, MODULE DEVICE, AND LUMINAIRE

INCORPORATION BY REFERENCE

The present invention claims priority under 35 U.S.C. §119 to Japanese Patent Application Nos. 2012-070445 and 2012-137652 filed on Mar. 26, 2012 and Jun. 19, 2012. The content of the application is incorporated herein by reference in their entirety.

FIELD

Embodiments described herein relate generally to a relay connector, a module including the relay connector, a module device including the module, and a luminaire including the module device.

BACKGROUND

In the past, there is a luminaire in which a substrate mounted with a plurality of LED elements is used and a plurality of the substrates are arrayed in one row to obtain a desired light beam.

Input connectors for supplying electric power to the LED elements are mounted on the respective substrates. For example, the input connectors of the substrates adjacent to each other are connected by a lead wire attached with relay connectors and the input connector on the substrate located at an end is connected to alighting circuit, whereby electric power is supplied from the lighting circuit to the substrates to turn on the LED elements on the substrates.

However, although the input connectors on the two substrates can be connected by the lead wire attached with the relay connectors, it may be impossible to regulate the movement of the two substrates in approaching directions of the substrates and position the substrates.

In general, substrates have dimensional tolerances. Mounting positions of input connectors on the substrates fluctuate. Therefore, if input connectors on two substrates are connected, it is desirable to take into account the dimensional tolerances of the substrates and the fluctuation in the mounting positions of the input connectors.

If a load is applied to the input connectors on the substrates, it is likely that a connection failure occurs between the substrates and the input connectors.

There are provided a relay connector that can position two substrates in approaching directions of the substrates and connect input connectors without applying a load to the input connectors even if the substrates have dimensional tolerances and mounting positions of the input connectors fluctuate, a module including the relay connector, a module device including the module, and a luminaire including the module device.

DETAILED DESCRIPTION

In general, according to one embodiment, a relay connector according to an embodiment connects two input connectors respectively mounted on mounting surfaces of two substrates, ends of which are arranged to be opposed to each other. The relay connector includes a relay connector main body and relay terminals. The relay connector main body includes a substrate regulating section interposed between the ends of the two substrates and set in contact with the ends of the two substrates to form a space between the ends of the two substrates. The relay terminals project from both ends of the relay connector main body to be connected to the input connectors.

With this configuration, the substrate regulating section of the relay connector is interposed between the ends of the two substrates to be set in contact with the ends of the two substrates to form the space between the ends of the two substrates. Therefore, it is possible to position the two substrates in approaching directions of the substrates and connect, using the relay connector, the input connectors without applying a load from the relay connector to the input connectors even if the substrates have dimensional tolerances and mounting positions of the input connectors fluctuate.

A first embodiment is explained with reference to FIGS. 1 to 7.

Figure 7:
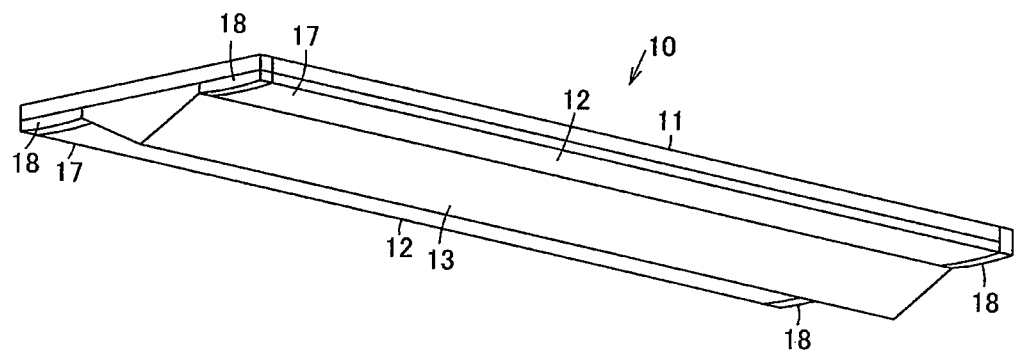
FIG. 7 is a perspective view of the luminaire.

As shown in FIG. 7, a luminaire 10 is a rectangular luminaire of a ceiling mounting type. The luminaire 10 includes a luminaire main body 11, module devices 12 arranged on both sides in the latitudinal direction of the luminaire main body 11, and a reflector 13 arranged between the module devices 12 on both the sides.

Figure 5:
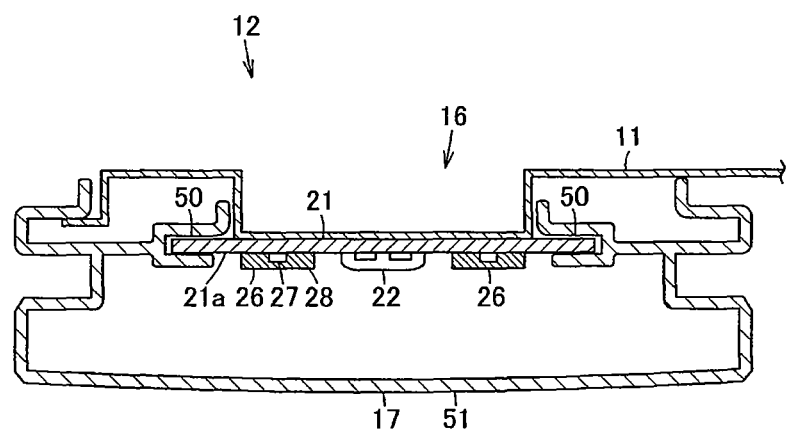
FIG. 5 is a sectional view of a module device including the module.
Figure 6:
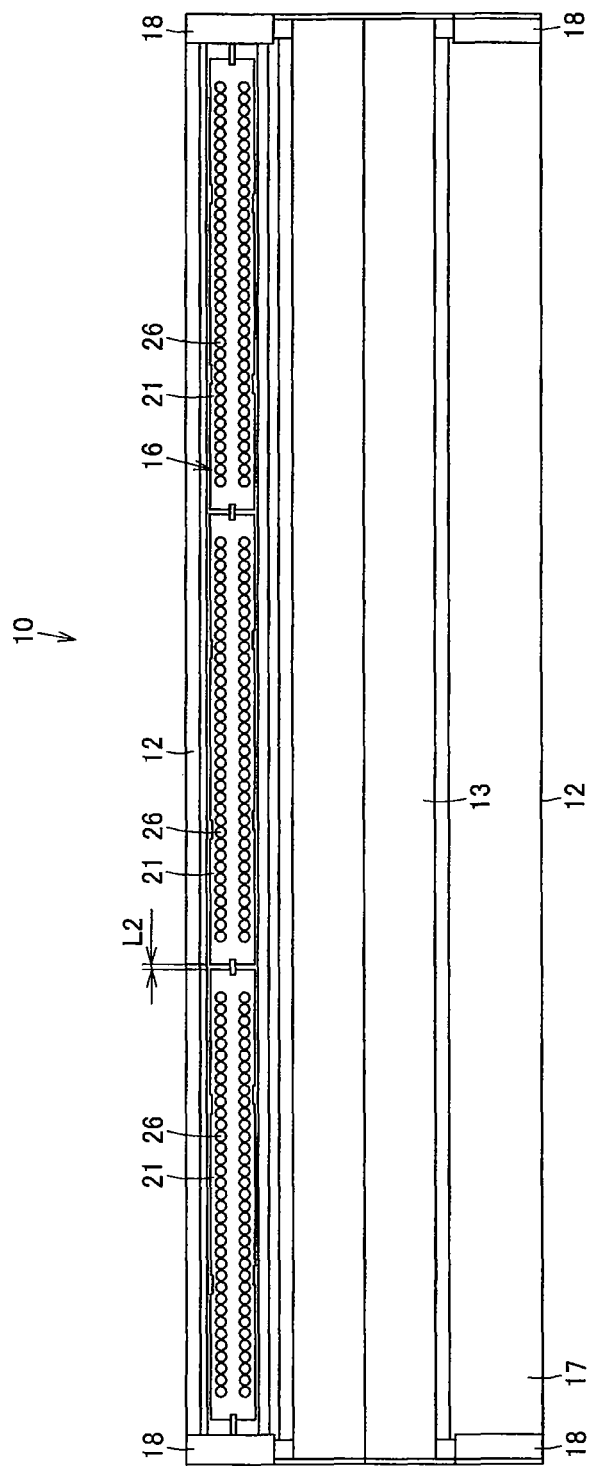
FIG. 6 is a front view of a luminaire including the module device.

As shown in FIGS. 5 and 6, the module device 12 includes a module 16, a case 17 that houses the module 16, and endplates 18 attached to both ends of the case 17.

As shown in FIGS. 1 to 6, the module 16 includes plural substrates 21 arrayed along a substrate connecting direction, input connectors 22 mounted at both ends of the substrates 21 corresponding to the substrate connecting direction of the substrates 21, and a relay connector 23 that connects the input connectors 22 on the substrates 21.

The substrate 21 is formed in an elongated rectangular shape along the substrate connecting direction. A mounting surface 21a including a wiring pattern is formed on one surface of the substrate 21. A thermal radiation surface 21b having a flat surface shape is formed on the other surface of the substrate 21. Plural light-emitting sections 26 are formed on the mounting surface 21a. The light-emitting sections 26 include LED elements 27 functioning as semiconductor light-emitting elements mounted on the wiring pattern and sealing resin 28 including phosphors that cover the LED elements 27. As the semiconductor light-emitting element, an LED package of a surface mounting type may be used or other elements such as an organic EL element may be used.

Groove sections 29 are formed in the center of both ends of the substrates 21.

The input connectors 22 are mounted near both ends of the mounting surfaces 21a of the substrates 21 to face the groove sections 29. The input connector 22 includes an input connector main body 32 and a pair of input terminals 33 arranged in the input connector main body 32.

The input connector main body 32 is made of synthetic resin having insulation properties and formed in a thin shape. A pair of cylindrical insertion holes 34 are formed on one end face of the input connector main body 32 a predetermined space apart from each other in the width direction parallel to the mounting surface 21a of the substrate 21. Wall sections 35 are formed on the inner sides in the insertion holes 34. Insert-through holes 35a are formed in the centers of the wall sections 35. Inclining surfaces 35b inclining to the insert-through holes 35a are formed on side surfaces of the wall sections 35. Terminal housing spaces 37 are formed to communicate with the insert-through holes 35a and open to the other end side of the input connector main body 32. Therefore, both ends of the insertion holes 34 are opened at both ends of the input connector main body 32.

The input terminals 33 are arranged in the terminal housing spaces 37. The input terminals 33 include pairs of contact sections 38 arranged on both sides in the terminal housing spaces 37 and having spring properties in directions in which the contact sections 38 approach each other. The input terminals 33 are soldered and connected to the wiring pattern of the substrate 21.

The relay connector 23 includes a relay connector main body 41 and a pair of relay terminals 42 piercing through the relay connector main body 41 and projecting from both ends of the relay connector main body 41.

The relay connector main body 41 is made of synthetic resin having insulation properties and formed in a thin shape by injection molding. A pair of cylindrical sections 43 are protrudingly provided on both end faces of the relay connector main body 41 a predetermined space apart from each other in the width direction. The relay terminals 42 are projected to the outside piercing through the centers of the cylindrical sections 43. The pair of cylindrical sections 43 can be inserted into the pair of insertion holes 34 of the input connector 22.

Pedestal sections 44 opposed to and riding over the substrate 21 are formed on one surface 41a, which is a wide surface of the relay connector main body 41, and the other surface 41b on the opposite side of the one surface 41a. Substrate regulating sections 45 further projecting than the pedestal sections 44 are formed. Inclining surfaces for facilitating the pedestal sections 44 to ride over the substrate 21 are formed at both ends of the pedestal sections 44.

The substrate regulating sections 45 are arranged in the groove sections 29 of the two substrates 21, ends of which are arranged to be opposed to each other. The substrate regulating sections 45 are interposed between the ends of the two substrates 21 to be set in contact with the ends of the two substrates 21 (ends 29a of the groove sections 29) to form a space 46 having a predetermined dimension between the ends of the two substrates 21. Spaces are formed between both sides of the substrate regulating sections 45 and both sides 29b of the groove sections 29 to prevent both the sides of the substrate regulating sections 45 and both the sides 29b of the groove sections 29 from coming into contact with each other. Therefore, the substrate regulating sections 45 regulate the ends of the two substrates 21 only in approaching directions of the two substrates 21. A projecting dimension of the substrate regulating sections 45 from the one surface 41a and the other surface 41b of the relay connector main body 41 is smaller than the thickness of the substrate 21.

Concave sections 47 opening to the outer surface side of the substrate regulating sections 45 are formed on the inner sides of the substrate regulating sections 45. The concave sections 47 are arranged between a pair of relay terminals 42 that pierce through the relay connector main body 41. Further, bottom sections 48 are formed in the concave sections 47.

The relay terminals 42 are linear pins. Both ends of the relay terminals 42 are formed in a pointed shape.

The relay connector 23 is formed in a common shape on the one surface 41a side and the other surface 41b side of the relay connector main body 41. In both directions in which the one surface 41a and the other surface 41b of the relay connector main body 41 face the substrate 21, the relay connector 23 can be connected to the input connectors 22. The movement of the substrate 21 can be regulated by the substrate regulating sections 45.

As shown in FIG. 5, the case 17 is made of synthetic resin having translucency and formed in the same sectional shape along the longitudinal direction. In the case 17, attachment grooves 50 on both sides for holding both the sides of the substrate 21 are formed to be opposed to each other. Translucent cover sections 51 are formed to be opposed to the light-emitting sections 26 of the substrate 21 attached to the attachment grooves 50 on both the sides. To assemble the plural substrates 21 to the case 17, the plural substrates 21 only have to be inserted into and arranged in the case 17 in order by inserting both the sides of the substrates 21 into the attachment grooves 50 on both the sides from the end of the case 17.

In a state in which the case 17 is attached to the luminaire main body 11, the thermal radiation surface 21b of the substrate 21 held by the case 17 is set in contact with the luminaire main body 11 to be capable of transferring heat.

As shown in FIG. 6, the end plates 18 are attached to both the ends of the case 17. The end plates 18 regulate both the end positions in the substrate connecting direction of the plural substrates 21 inserted into the case 17.

In the module device 12 according to this embodiment, as shown in FIG. 6, three substrates 21 are arranged in the case 17 along the substrate connecting direction. The substrates 21 are connected by the relay connectors 23. A wire from a lighting device is connected to the input connector 22 on the outer end side of the substrate 21 located on one end side. A connector for connecting the input terminals 33 of the input connector 22 on the outer end side of the substrate 21 located on the other end side is connected to the input connector 22. The lighting device is disposed in the luminaire main body 11. The lighting device supplies electric power for turning on the LED elements 27 to the substrates 21 connected in series.

To assemble the module device 12, the module 16 is assembled while the plural substrates 21 are inserted in order from the end of the case 17. The end plates 18 are attached to both the ends of the case 17.

To assemble the module 16, as shown in FIGS. 1 to 4, the input connectors 22 of the substrates 21 to be connected are connected by the relay connector 23. The plural substrates 21 are connected in series.

To connect the relay connector 23 to the input connector 22, the pair of relay terminals 42 of the relay connector 23 are inserted into the pair of insertion holes 34 of the input connector 22, inserted through the insert-through holes 35a, and pressed into between the pairs of contact sections 38 of the input terminals 33. The pair of cylindrical sections 43 are inserted into the pair of insertion holes 34. The distal ends of the pair of relay terminals 42 pressed into between the pairs of contact sections 38 of the input terminals 33 project from the input connector 22. A connection state of the pair of relay terminals 42 can be checked.

In a process of connecting the relay connector 23 to the input connector 22, the pedestal section 44 formed on the surface of the relay connector main body 41 opposed to the substrate 21 side rides over or is opposed to the substrate 21. The substrate regulating sections 45 intrude into the groove sections 29. The substrate regulating sections 45 intruding into the groove section 29 come into contact with the end of the substrate 21 (the end 29a of the groove section 29), whereby the relay connector 23 and the substrate 21 are positioned. Consequently, the relay connector 23 and the input connector 22 are positioned. The substrate regulating sections 45 of the relay connector 23 are interposed between the two substrates 21 to be set in contact with the ends of the two substrates 21 to form the space 46 between the ends of the two substrates 21.

The relay connector 23 can be connected to the input connectors 22 in both the directions in which the one surface 41a and the other surface 41b of the relay connector main body 41 are opposed to the substrate 21. Since the substrate regulating sections 45 are provided on both the one surface 41a and the other surface 41b of the relay connector main body 41, there is no directionality in the connection of the relay connector 23.

In the assembled module 16, the plural substrates 21 are electrically connected via the relay terminals 42 of the relay connectors 23.

Figure 1:
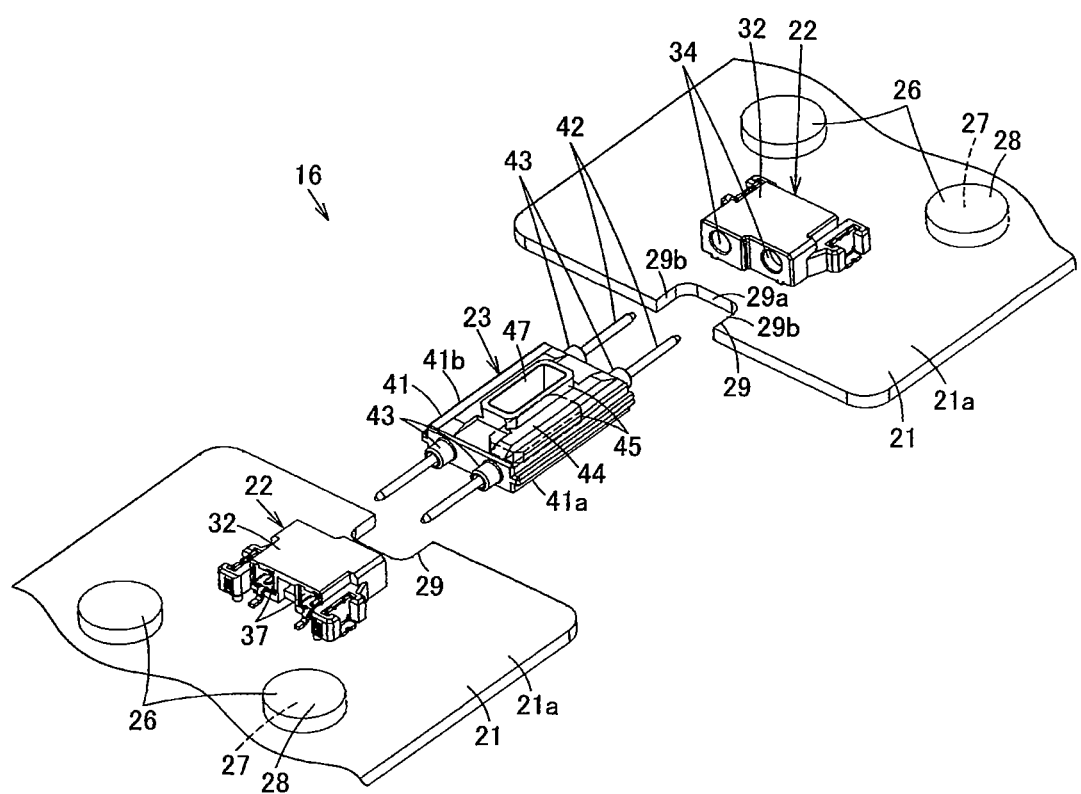
FIG. 1 is a perspective view of a module including a relay connector according to a first embodiment.
Figure 2:
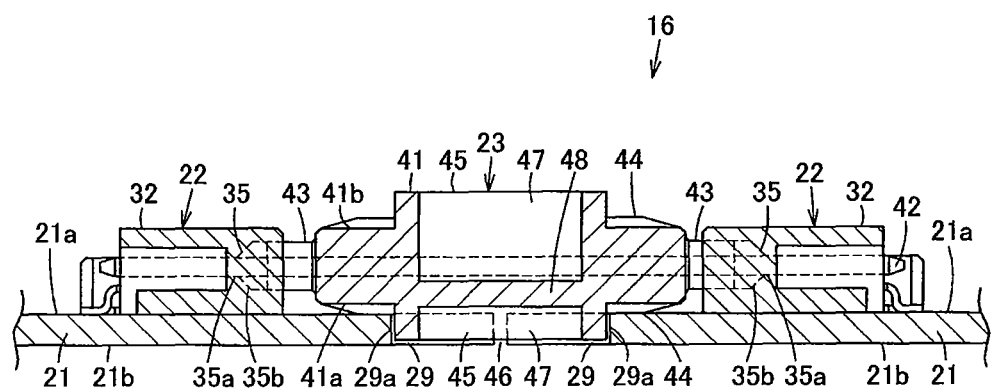
FIG. 2 is a sectional view in a longitudinal direction of the module.
Figure 3:
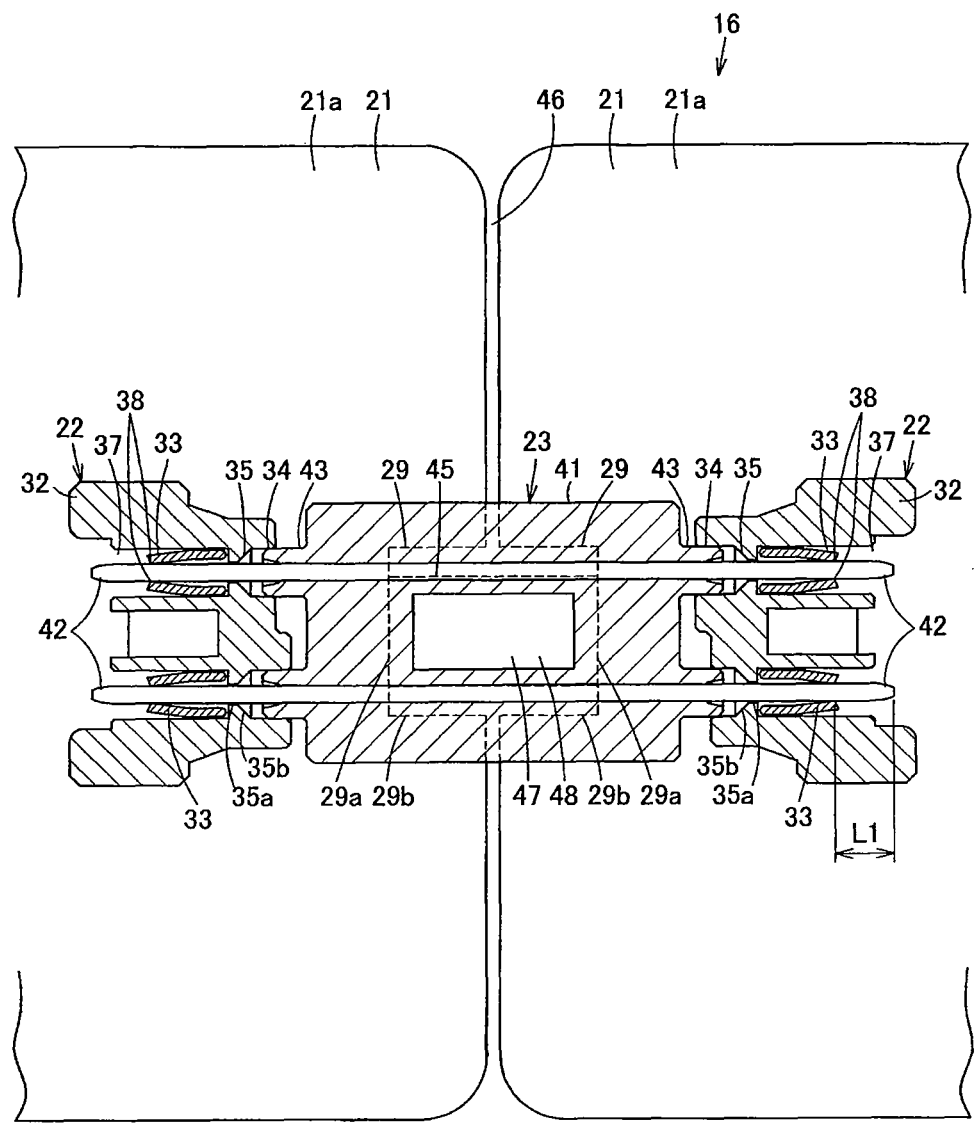
FIG. 3 is a sectional view in a lateral direction of the module.
Figure 4:
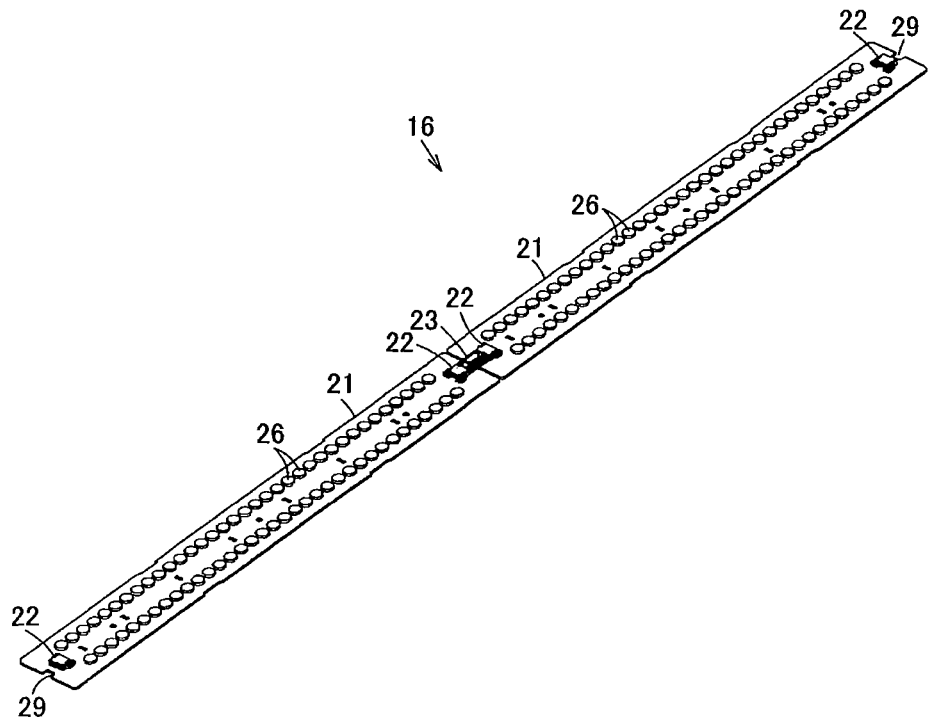
FIG. 4 is a perspective view of the module.

Further, the substrate regulating sections 45 of the relay connector 23 are interposed between the two substrates 21 to be set in contact with the ends of the two substrates 21. The space 46 is formed between the ends of the two substrates 21. In a position where the substrate regulating sections 45 of the relay connector 23 are in contact with the end of the substrate 21, as shown in FIG. 3, the end face of the relay connector 23 is not in contact with the end face of the input connector 22. A space is present between the end faces. The distal end surfaces of the cylindrical sections 43 are not in contact with the wall sections 35 in the insertion holes 34. Spaces are present between the distal end surfaces and the wall sections 35. Therefore, a load is not applied from the relay connector 23 to the input connector 22. Reliability of connected portions where the input terminals 33 of the input connector 22 are connected to the substrate 21 by soldering can be secured.

Therefore, the substrate regulating sections 45 of the relay connector 23 are interposed between the two substrates 21 to be set in contact with the ends of the two substrates 21 to form the space 46 between the ends of the two substrates 21. Therefore, it is possible to regulate the movement of the two substrates 21 in the approaching directions of the substrates 21 to position the two substrates 21. Even if the substrates 21 have dimensional tolerances and the mounting positions of the input connectors 22 fluctuate, it is possible to connect the input connectors 22 using the relay connector 23 without applying a load to the input connectors 22.

The pair of cylindrical sections 43 of the relay connector 23 are inserted into the pair of insertion holes 34 of the input connector 22, whereby the relay connector 23 and the input connector 22 can be positioned in a direction orthogonal to the substrate connecting direction. Consequently, it is possible to prevent a load from being applied to the relay terminals 42 inserted into the input connector 22 and prevent occurrence of a connection failure due to deformation or damage of the relay terminals 42.

Since the concave sections 47 are formed on the inner sides of the substrate regulating sections 45, it is possible to reduce an amount of use of the material of the relay connector main body 41 and realize a reduction in weight and a reduction in cost.

Since the bottom sections 48 are formed in the concave sections 47, it is possible to secure strength even if the concave sections 47 are provided.

The concave sections 47 are arranged between the two relay terminals 42 that pierce through the relay connector main body 41. Therefore, the concave sections 47 do not interfere with the relay terminals 42. The relay terminals 42 are not exposed in the concave sections 47.

The projecting dimension of the substrate regulating sections 45 from the one surface 41a and the other surface 41b of the relay connector main body 41 is smaller than the thickness of the substrate 21. Therefore, in an assembled state of the luminaire 10, it is possible to set the substrate 21 in contact with the luminaire main body 11 to be capable of transferring heat and improve thermal radiation properties of heat generated while the LED elements 27 are lit.

The relay connector main body 41 includes the cylindrical sections 43 projected from both the end faces of the relay connector main body 41 and inserted into the insertion holes 34 of the input connectors 22. The relay terminals 42 pierce through the cylindrical sections 43. Therefore, it is possible to improve the insulation properties of the relay terminals 42.

Both the ends of the insertion holes 34 of the input connector main body 32 are opened. The distal ends of the relay terminals 42 inserted from the one ends of the insertion holes 34 and connected to the input terminals 33 project from the other ends of the insertion holes 34. Therefore, it is possible to easily check that the relay terminals 42 are connected to the input terminals 33.

In the assembled module device 12, both the sides of the plural substrates 21 are held by the attachment grooves 50 of the case 17. The positions in the substrate connecting direction of the plural substrates 21 are regulated by the end plates 18 at both the ends. However, the plural substrates 21 are not fixed to the case 17. Therefore, the length of the module 16 is set smaller than the dimension between the end plates 18 at both the ends taking into account thermal expansion of the substrates 21. Alternatively, the substrates 21 move in the substrate connecting direction between the end plates 18 at both the ends because of the influence of a dimensional error or the like. In this case, it is likely that the relay connector 23 and the input connector 22 separate from each other according to the movement of the substrates 21 and the relay terminals 42 come off the input terminals 33.

Therefore, in a state in which the relay connector 23 is closest to the input connector 22, i.e., in a position where the substrate regulating sections 45 of the relay connector 23 are in contact with the end faces of the substrates 21, a dimension L1 (see FIG. 3) of projection of the relay terminals 42 from the input terminals 33 is set larger than a maximum dimension L2 (see FIG. 6) in which the substrates 21 can move between the end plates 18 at both ends. Consequently, even if the substrates 21 move between the end plates 18 at both the ends, the relay terminals 42 do not come off the input terminals 33. It is possible to maintain the connected state of the relay terminals 42 and the input terminals 33.

By forming the contact sections 38 of the input terminals 33 as, for example, curved surfaces rather than edges, the relay terminals 42 may be allowed to easily slide in the axis direction with respect to the contact sections 38. Consequently, it is possible to reduce a load applied to the connected portions of the input terminals 33 and the substrate 21 when the relay terminals 42 are connected to the input terminals 33. Further, even if the relay terminals 42 are thermally deformed in the axis direction, it is possible to reduce a load applied to the connected portions of the input terminals 33 and the substrate 21.

The substrate 21 may be screwed to the case 17 or the luminaire main body 11.

Figure 8:
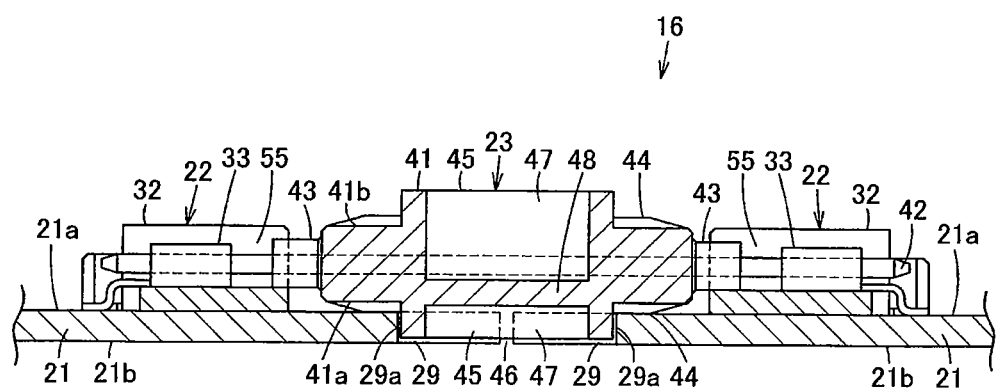
FIG. 8 is a sectional view of a module according to a second embodiment.

A second embodiment is shown in FIG. 8. Components and action and effects same as those in the first embodiment are denoted by the same reference numerals and signs. Explanation of the components and the action and effects is omitted.

In the input connector 22, the relay terminals 42 of the relay connector 23 can be connected from a direction perpendicular to the mounting surface 21a of the substrate 21. In other words, the input connector 22 can be connected from a radial direction orthogonal to the axis direction of the relay terminals 42.

A pair of groove sections 55 opening to the opposite side of the substrate 21 side are provided in the input connector main body 32. The input terminals 33 are arranged in the groove sections 55. The input terminals 33 include pairs of terminal sections that hold the relay terminals 42 inserted into the groove sections 55. The distal ends of the pairs of terminal sections are formed in a shape opened to an opening direction of the groove sections 55 to make it easy to insert the relay terminals 42.

The relay terminals 42 of the relay connector 23 are inserted into the groove sections 55 and connected to the input terminals 33 from a direction perpendicular to the mounting surface 21a of the substrate 21.

In the second embodiment, as in the first embodiment, the substrate regulating sections 45 of the relay connector 23 are interposed between the two substrates 21 to be set in contact with the ends of the two substrates 21 to thereby form the space 46 between the ends of the two substrates 21. Therefore, it is possible to absorb the dimensional tolerances of the substrates 21 and the fluctuation in the mounting positions of the input connectors 22. It is possible to regulate the movement of the two substrates 21 in the approaching directions of the substrates 21 and position the substrates 21 without applying a load to the input connectors 22.

The module can also be applied to a substrate on which a lighting circuit and a power supply circuit are mounted, a substrate on which other electric circuits are mounted, and the like besides a substrate on which the semiconductor light-emitting element is mounted.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A relay connector that is configured to connect two input connectors respectively mounted on mounting surfaces of two substrates that have ends arranged to be opposed to each other, the relay connector comprising:
a relay connector main body including a substrate regulating section configured to be interposed between the ends of the two substrates and set in contact with the ends of the two substrates to form a space between the ends of the two substrates; and
relay terminals projecting from both ends of the relay connector main body to be connected to the input connectors.

2. The relay connector according to claim 1, wherein the space between the ends of the two substrates formed by the substrate regulating section is large enough to prevent end faces of the relay connector main body from coming into contact with end faces of the input connectors.

3. The relay connector according to claim 1, wherein the substrate regulating section protrudes from a first surface of the relay connector main body and a second surface of the relay connector main body that is opposite the first surface.

4. The relay connector according to claim 3, wherein a concave section is formed on an inner side of the substrate regulating section.

5. The relay connector according to claim 4, wherein a bottom section is formed in the concave section.

6. The relay connector according to claim 4, wherein
the relay terminals are arranged to pierce through the relay connector main body and are spaced apart from each other by a predetermined distance, and
the concave section of the substrate regulating section is arranged between the relay terminals.

7. The relay connector according to claim 3, wherein a protruding dimension of the substrate regulating section from the first surface and the second surface of the relay connector main body is smaller than a thickness of the substrates.

8. The relay connector according to claim 1, wherein
the relay connector main body includes cylindrical sections projecting from both end faces of the relay connector main body that are to be inserted into the input connectors, and
the relay terminals are provided to pierce through centers of the cylindrical sections.

9. A module comprising:
a plurality of substrates including mounting surfaces on which input connectors are mounted; and
a relay connector that connects input connectors of two adjacent substrates, the relay connector including a relay connector main body having a substrate regulating section that is interposed between ends of the two adjacent substrates and set in contact with the ends of the two substrates to form a space between the ends of the two substrates, and relay terminals projecting from both ends of the relay connector main body and connected to the input connectors.

10. The module according to claim 9, wherein
the input connectors include input terminals and insertion holes, and
the relay connector main body includes cylindrical sections that project from the relay connector main body and are inserted into insertion holes, the relay terminals piercing through centers of the cylindrical centers and the insertion holes to be connected to the input terminals.

11. The module according to claim 10, wherein
the input connectors further include wall sections between the input terminals and the insertion holes, and
distal end surfaces of the cylindrical sections are not in contact with the wall sections when the substrate regulating section is in contact with ends of the substrates.

12. The module according to claim 9, wherein
the input connectors include groove sections opened on a side opposite the substrate side and input terminals are arranged in the groove sections, and
the relay terminals of the relay connectors are inserted into the groove sections from a direction perpendicular to a plane of the mounting surfaces of the substrates and connected to the input terminals.

13. A lighting module comprising:
first and second substrates each having at least one light emitting element and an input connector mounted thereon; and
a relay connector having a main body and relay terminals projecting from a first end of the main body to be connected to the input connector mounted on the first substrate and projecting from a second end of the main body to be connected to the input connector mounted on the second substrate, the relay connector being configured to maintain the first and second substrates to be at least a predetermined distance from each other.

14. The module according to claim 13, wherein the relay connector includes a substrate regulating section that is interposed between the first and second substrates and set in contact with ends of the first and second substrates to separate the first and second substrates by at least the predetermined distance.

15. The module according to claim 14, wherein the substrate regulating section is configured to prevent end faces of the main body from coming into contact with end faces of the input connectors mounted on the first and second substrates.

16. The module according to claim 15, wherein the substrate regulating section protrudes from a first surface of the main body and a second surface of the main body that is opposite the first surface.

17. The module according to claim 16, wherein a concave section is formed on an inner side of the substrate regulating section, and a bottom section is formed in the concave section.

18. The module according to claim 17, wherein
the relay terminals are arranged to pierce through the main body and are spaced apart from each other by a predetermined distance, and
the concave section of the substrate regulating section is arranged between the relay terminals.

19. The module according to claim 16, wherein a protruding dimension of the substrate regulating section from the first surface and the second surface of the main body is smaller than a thickness of the first and second substrates.

20. The relay connector according to claim 13, wherein
the main body includes cylindrical sections projecting from both end faces of the main body that are to be inserted into the input connectors, and
the relay terminals are provided to pierce through centers of the cylindrical sections.

* * * * *